United States Patent
Chen et al.

(10) Patent No.: US 7,585,737 B2
(45) Date of Patent: Sep. 8, 2009

(54) METHOD OF MANUFACTURING DOUBLE DIFFUSED DRAINS IN SEMICONDUCTOR DEVICES

(75) Inventors: Hung-Lin Chen, Pingtung (TW); Shao-Yen Ku, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 313 days.

(21) Appl. No.: 11/607,675

(22) Filed: Nov. 30, 2006

(65) Prior Publication Data
US 2008/0132024 A1    Jun. 5, 2008

(51) Int. Cl.
*H01L 21/336* (2006.01)
(52) U.S. Cl. .................. 438/301; 438/306; 438/529
(58) Field of Classification Search ........... 257/E21.435
See application file for complete search history.

(56) References Cited

U.S. PATENT DOCUMENTS

| 4,717,684 A | 1/1988 | Katto et al. |
| 2004/0053481 A1* | 3/2004 | Chakravarthi et al. ....... 438/514 |
| 2004/0150066 A1* | 8/2004 | Inoue et al. ................. 257/500 |
| 2005/0118768 A1 | 6/2005 | Chen |

FOREIGN PATENT DOCUMENTS

| JP | 61-137369 | 6/1986 |
| TW | 476153 B | 2/2002 |

* cited by examiner

*Primary Examiner*—Stephen W Smoot
(74) *Attorney, Agent, or Firm*—Haynes and Boone, LLP

(57) ABSTRACT

A method of manufacturing double diffused drains in a semiconductor device. An embodiment comprises forming a gate dielectric layer on a substrate, and masking and patterning the gate dielectric layer. Once the gate dielectric layer has been patterned, a second dielectric layer, having a different depth than the gate dielectric layer, is deposited into the pattern. Once the dielectric layers have been placed into a step form, DDDs are formed by implanting ions through the two dielectric layers, whose different filtering properties form the DDDS. In another embodiment the implantations through the two dielectric layers are performed using different energies to form the different dose regions. In yet another embodiment the implantations are performed using different species (light and heavy), instead of different energies, to form the different dose regions.

20 Claims, 7 Drawing Sheets

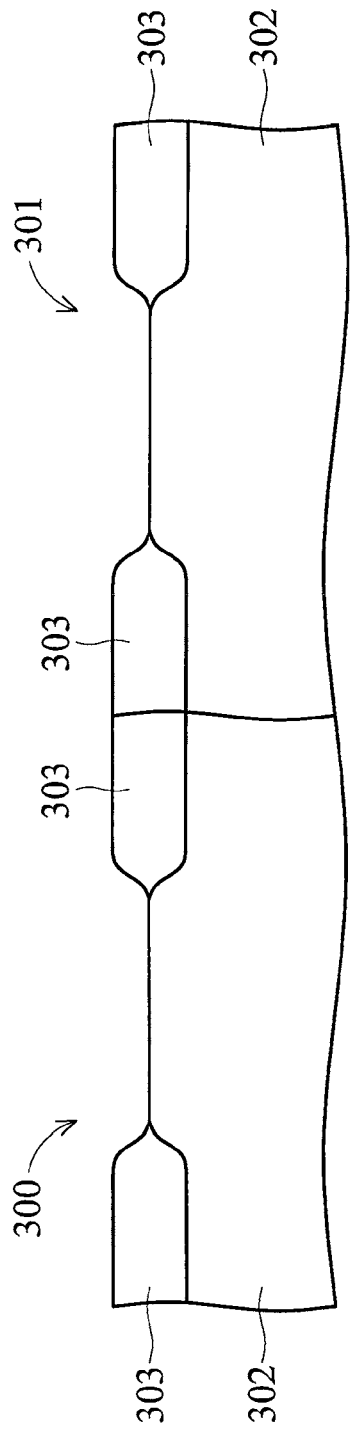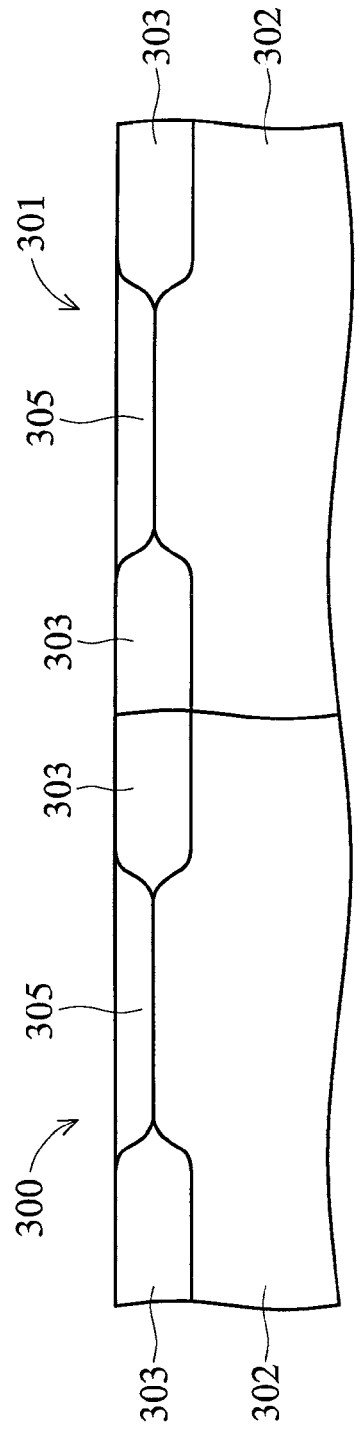
FIG. 3A
FIG. 3B

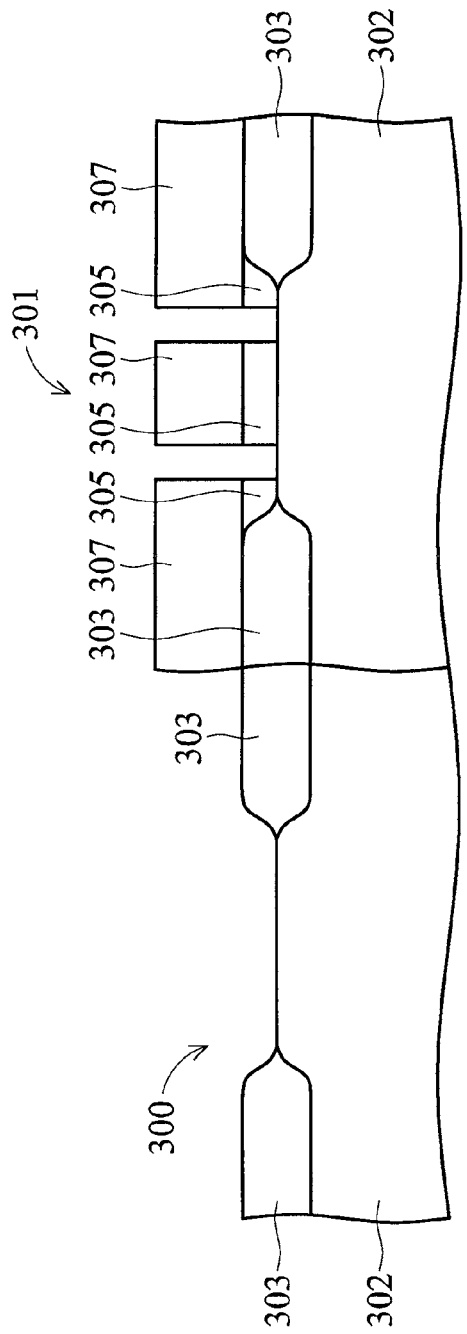
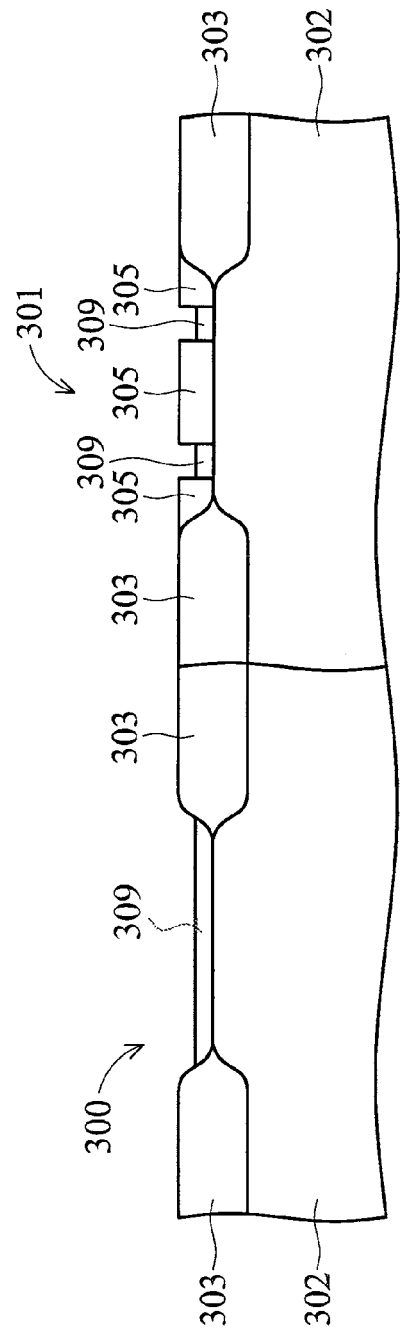
FIG. 3C
FIG. 3D

METHOD OF MANUFACTURING DOUBLE DIFFUSED DRAINS IN SEMICONDUCTOR DEVICES

TECHNICAL FIELD

The present invention relates generally to methods of manufacturing semiconductor devices and, more particularly, to a method of forming double diffused drains (DDD) in metal oxide semiconductor field effect transistors (MOSFETs).

BACKGROUND

As the size and dimensions of transistors are reduced, shallower source and drain regions must be created. However, the high doping concentrations that are required for these shallow source and drain regions lead to an increase in the electric field in the channel of the device. This electric field, if large enough, can cause "hot carrier" problems, whereby electrons in the channel region gain enough energy to be ejected from the channel region and into the gate dielectric. This "hot carrier" phenomenon leads to long-term device degradation and reduced reliability.

One approach to minimize the "hot carrier" problem is by using a double diffused drain (DDD) method, in which two implants are performed to create source and drain regions. For example, a DDD is often used as a source or drain in a high voltage metal oxide semiconductor (HVMOS) transistor. A DDD also, in addition to immunizing against "hot carrier" problems, provides a high breakdown voltage for a HVMOS transistor and prevents electrostatic discharge that may result in the destruction of a semiconductor device.

These DDDs can be formed through a variety of methods. FIGS. 1A through 1D illustrate one such method. Referring first to FIG. 1A, a substrate 101 is provided with isolation regions 103 formed thereon. A transistor gate stack 105 is formed on the substrate 101, the transistor gate stack 105 comprising of a gate dielectric 107 and a gate electrode 109. FIG. 1B shows a first implantation of one species, such as phosphorous, to form a first source/drain region 111. FIG. 1C shows a second implantation of a different species, such as arsenic, to form a second source/drain region 113 overlying the first source/drain region 111. Finally, FIG. 1D shows the completed DDD after a thermal anneal has been performed in order to drive in the first source/drain region 111.

Unfortunately, this process is not ideal for the manufacturing of semiconductor devices. In order to complete this process, a thermal anneal must be performed in order to get the desired implantation. This thermal anneal is very heat intensive, and requires extra thermal budget in order to complete, which leads to higher manufacturing costs.

FIGS. 2A through 2D illustrate another method for forming DDDs. Referring first to FIG. 2A, substrate 201 having isolation regions 203 and a transistor gate 205 formed thereon is shown, wherein the transistor gate 205 comprises a gate dielectric 207 and gate electrode 209. Similar to the process described above with reference to FIG. 1B, FIG. 2B illustrates a first implantation to form a first source/drain region 211. FIG. 2C shows the formation of a mask layer 213 over the substrate 201, the isolation regions 203, and the transistor gate stack 205. FIG. 2D shows the resulting structure after a second implantation has been performed to form a second source/drain region 215, and the mask layer 213 has been removed.

Unfortunately, this is not an ideal process either. By using the masking layer, another step is included in what is already a complicated process for making semiconductor devices, thereby adding time, money, and preparation to the process.

Because of these and other problems associated with the manufacturing of DDDs in semiconductor devices, a new method for fabricating DDDs is needed.

SUMMARY OF THE INVENTION

These and other problems are generally solved or circumvented, and technical advantages are generally achieved, by preferred embodiments of the present invention that allow for a simpler, more cost effective method of forming DDDs in semiconductor devices.

One aspect of the present invention is a method of forming a semiconductor device that contains DDDs. The method comprises providing a substrate with isolation regions formed thereon and forming a first dielectric layer (which will also be used as the gate dielectric) over the substrate. The first dielectric layer is patterned to expose portions of the substrate. A second dielectric layer is formed over the exposed portions of the substrate, and the second dielectric layer has a thickness different than that of the first dielectric layer. A gate electrode is formed overlying the gate dielectric. Finally, implantations are performed through the first and second dielectric layers to form the double diffuse drain regions.

Another aspect of the present invention is another method of forming a semiconductor device with DDDs. The method comprises providing a substrate with isolation regions formed thereon and forming a first dielectric layer over the substrate. The first dielectric layer is patterned, substantially exposing portions of the substrate. A second dielectric layer is then formed over the exposed portions of the substrate, such that the second dielectric layer has a different thickness than the first dielectric layer. A gate electrode is then deposited over the gate dielectric. An implant using a first type of energy is performed to create a first dose region of the DDD, and a second implant is performed using a second type of energy to form a second dose region of the DDD. The differences in the dielectric layers and the energy of the dopants as they are implanted through the two dielectric layers form the resultant DDDs.

In another aspect of the present invention similar to the embodiment described above, light and heavy species are implanted through the stepped dielectric layers. The differences in the dielectric layers and molecules as they pass through the dielectric layers result in the formation of the DDDs in the substrate.

By using this process to form DDDs in a semiconductor device, some of the problems with the prior methods of forming DDDs are abolished. There is no extra annealing that must be performed in order to drive the dopants further into the substrate, and there is no extra masking layer that must be placed and removed in order to implant a second species. The present invention makes the process simpler (without extra steps) and cheaper (by abolishing the thermal requirements for annealing).

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A-3F illustrate an embodiment of the present invention to form DDDs.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1A:
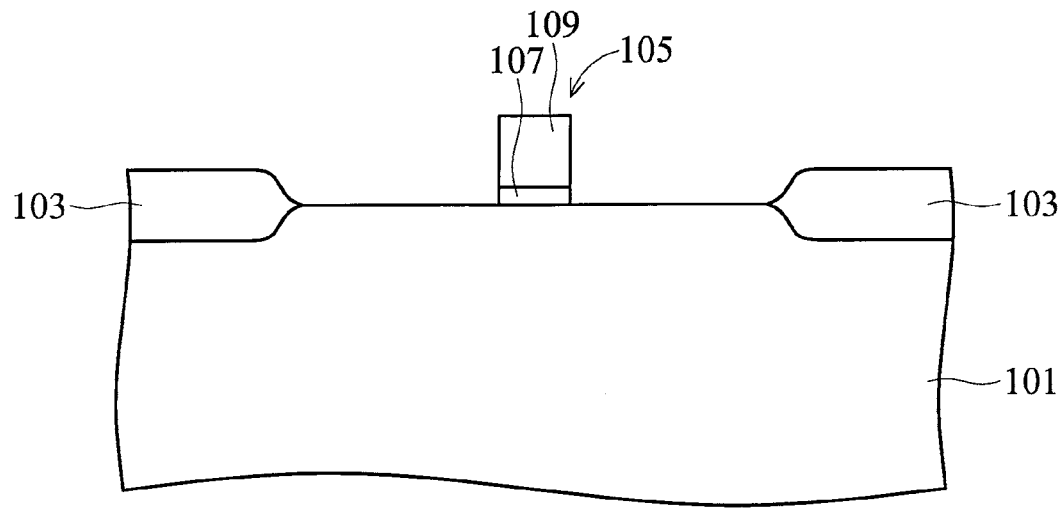
FIGS. 1A-1D illustrate a prior art method of forming DDDs in a semiconductor device using a thermal anneal.
Figure 1B:
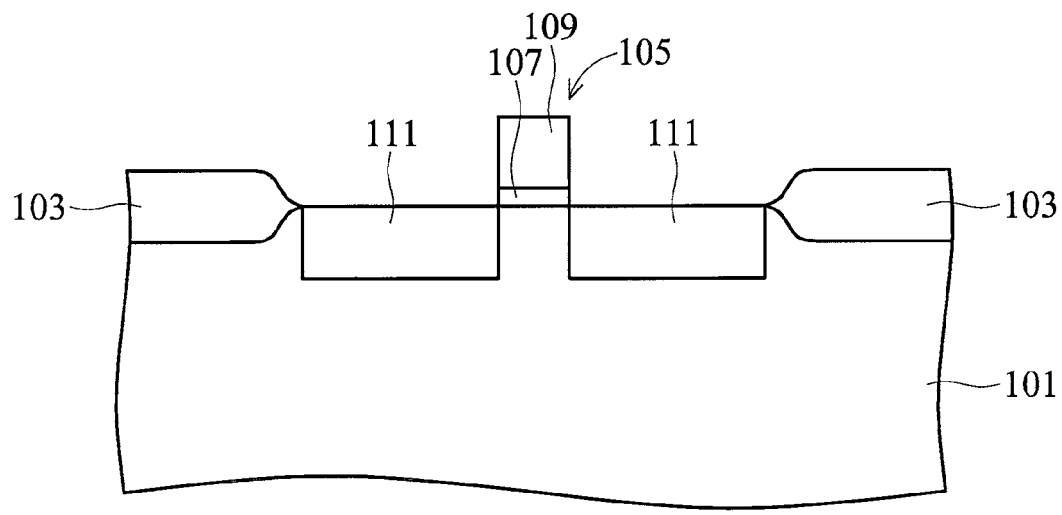
Figure 1C:
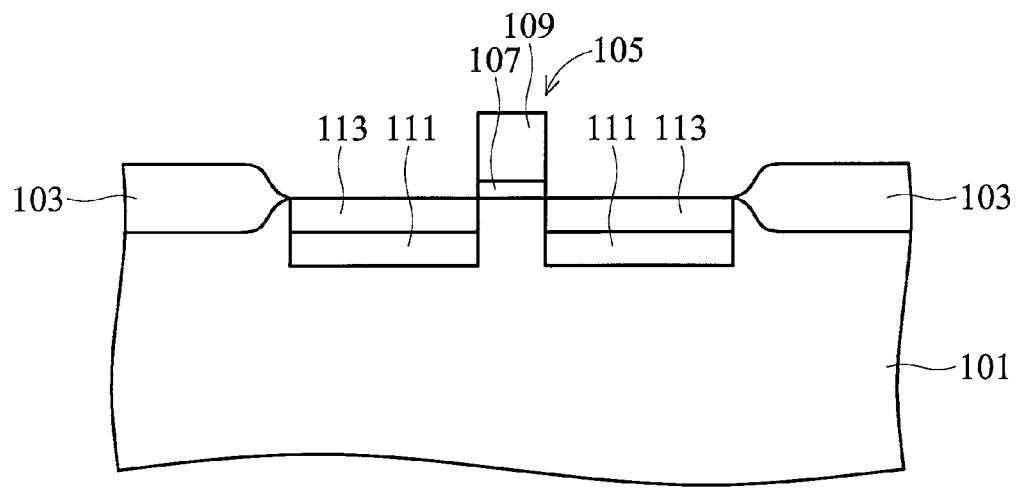
Figure 1D:
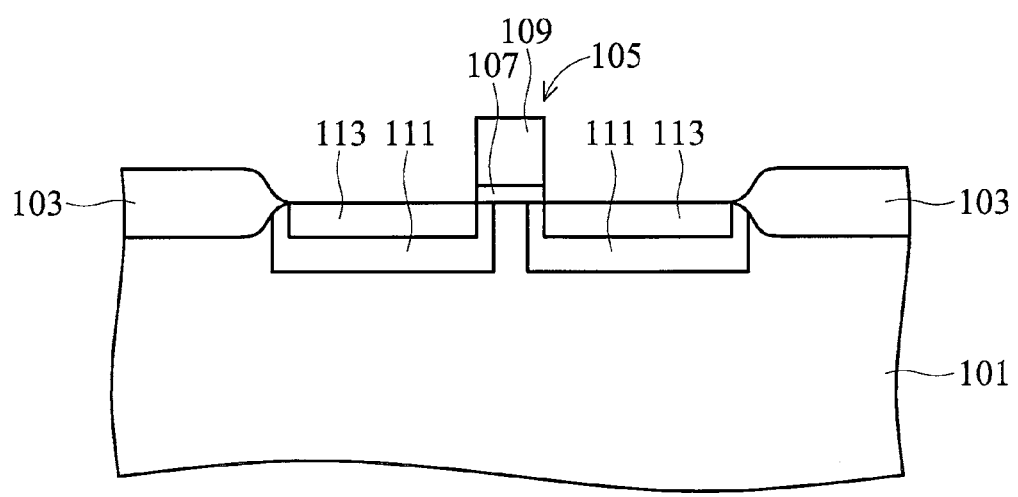
Figure 2A:
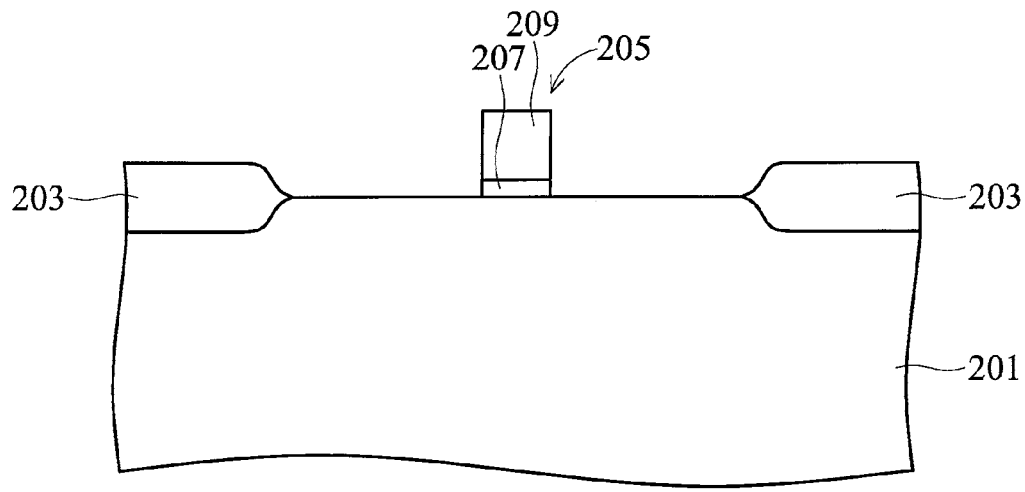
FIGS. 2A-2D illustrate a prior art method of forming DDDs in a semiconductor device using an additional masking layer between implantations.
Figure 2B:
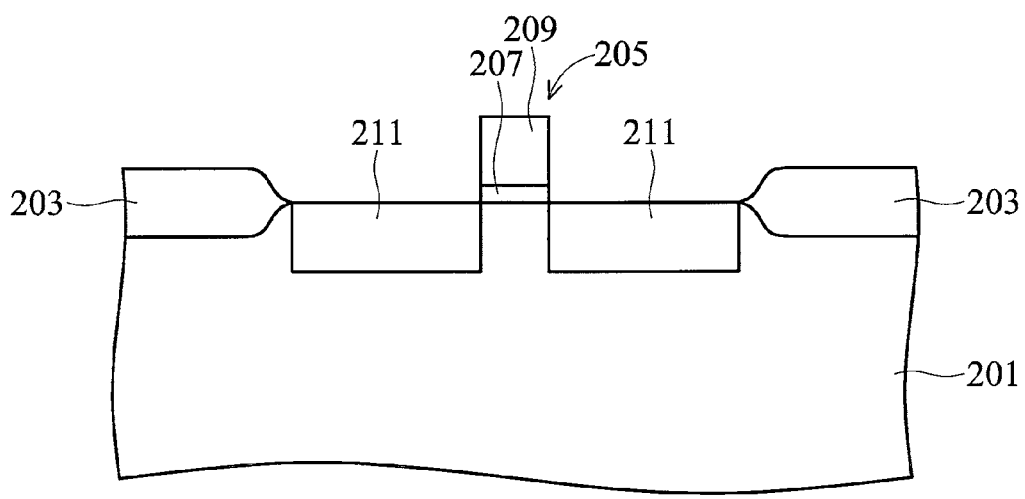
Figure 2C:
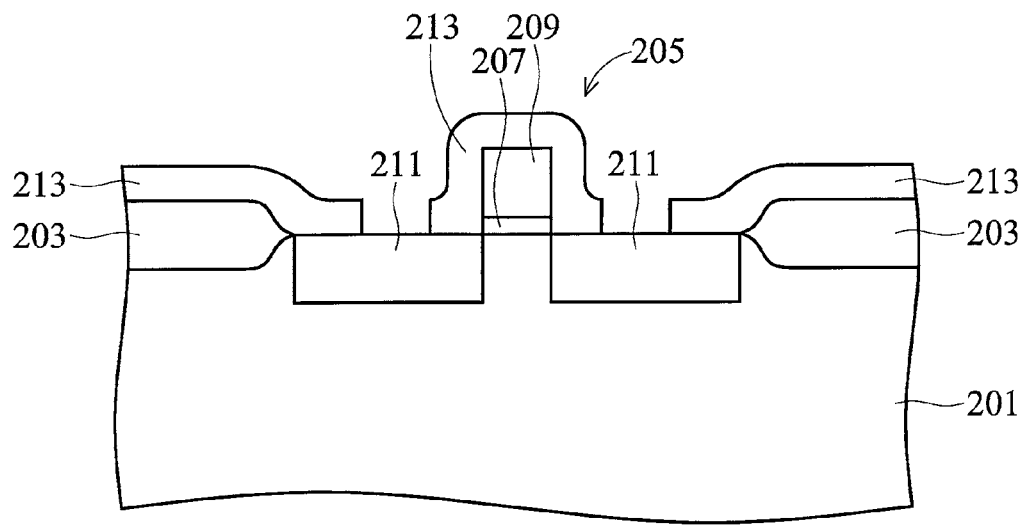
Figure 2D:
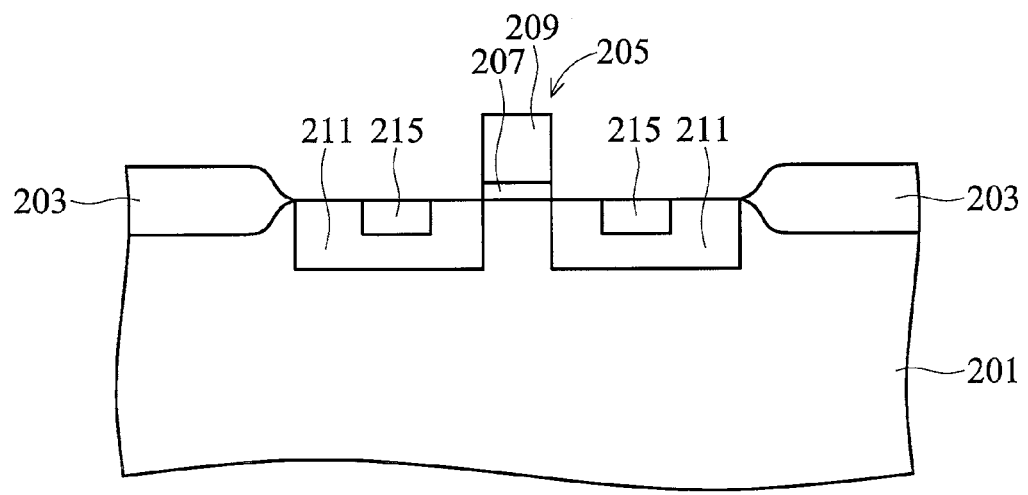

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of forming DDDs in a MOSFET. The invention may also be applied, however, to making other devices requiring a multiple diffused region.

FIG. 3A illustrates a substrate 302 with a high voltage region 301 and a low voltage region 300. Isolation regions 303 separate active regions, including separating the high voltage region 301 and the low voltage region 300. The high voltage region 301 and the low voltage region 300 may be located adjacent to each other on the substrate 302, or may be separated (as shown in FIG. 3A by the wavy line between the two regions).

The substrate 302 may comprise bulk silicon, doped or undoped, or an active layer of a silicon on insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Generally, isolation regions 303 act to electrically isolate electronic devices formed on the substrate 302. In an embodiment, the isolation regions 303 are field oxide regions, and can be formed by local oxidation of silicon (LOCOS) or by patterning trenches in the substrate 302 and filling the trenches with silicon oxide or another insulative material. However, other materials and techniques known in the art, such as shallow trench isolations (STIs), can be used to isolate this device from other devices on the substrate 302.

FIG. 3B illustrates the deposition of a first dielectric layer 305 over the exposed areas of the substrate 302 in both the high voltage region 301 and the low voltage region 300. The first dielectric layer 305 is preferably an oxide layer that has a thickness of between about 300 Å and about 2,000 Å. The first dielectric layer 305 may be formed by chemical vapor deposition (CVD) techniques using tetra-ethyl-ortho-silicate (TEOS) and oxygen as a precursor. Other processes and materials known in the art may be used. Other materials, such as silicon oxide, nitrogen-containing oxide, aluminum oxide, lanthanum oxide, hafnium oxide, zirconium oxide, hafnium oxynitride, combinations thereof, or the like, may also be used.

FIG. 3C illustrates the patterning of the first dielectric layer 305. A photoresist masking layer 307 is deposited over the first dielectric layer 305 in the high voltage region 301 and subsequently exposed and developed, as known in the art, to form the pattern as shown in FIG. 3C in the high voltage region 301. The masking layer 305 does not mask any of the first dielectric layer 305 in the low voltage region 300. Thereafter, exposed portions of the first dielectric layer 305 are removed, including the first dielectric layer 305 in the low voltage region 300. In an embodiment exposed portions of the dielectric layer 305 are removed, thereby substantially exposing the underlying substrate 302. The photoresist masking layer 307 is subsequently removed.

FIG. 3D illustrates the formation of a second dielectric layer 309. In the high voltage region 301 this second dielectric layer 309 is formed over the exposed portions of the substrate 302 within the openings of the first dielectric layer 305, forming a step pattern between the first dielectric layer 305 and the second dielectric layer 309. In the low voltage region 300 the second dielectric layer 309 is formed over the exposed portions of the substrate 302. The second dielectric layer 309 is preferably an oxide layer having a thickness of between about 30 Å and about 120 Å. The second dielectric layer 309 may be formed by chemical vapor deposition (CVD) techniques using tetra-ethyl-ortho-silicate (TEOS) and oxygen as a precursor. Other processes and materials known in the art may be used. Other materials, such as silicon oxide, nitrogen-containing oxide, aluminum oxide, lanthanum oxide, hafnium oxide, zirconium oxide, hafnium oxynitride, combinations thereof, or the like, may also be used.

Figure 3E:
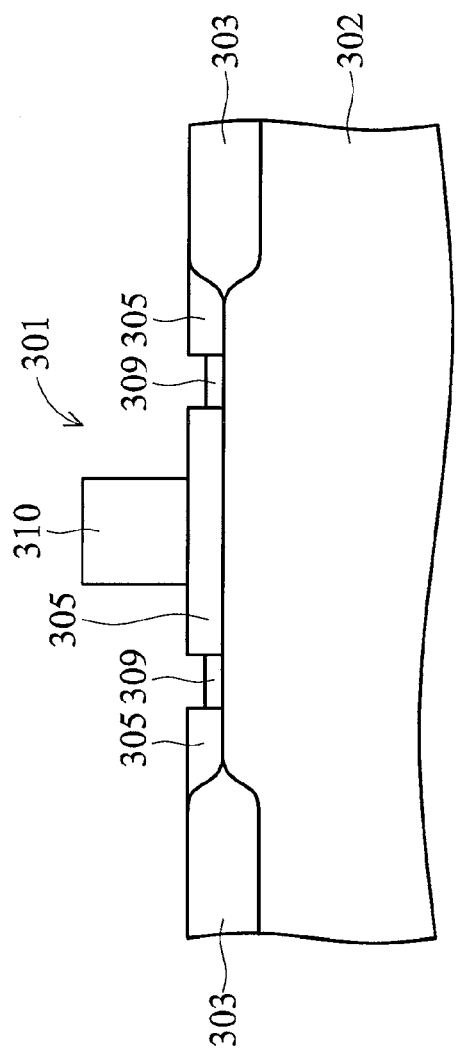

FIG. 3E shows an enlarged version of the high voltage region 301 by itself, and illustrates the formation of the gate electrode 310. The gate electrode 310 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In the preferred embodiment in which the gate electrode 310 is poly-silicon, the gate electrode 310 may be formed by depositing doped or undoped poly-silicon by low-pressure chemical vapor deposition (LPCVD) to a thickness in the range of about 400 Å to about 2,500 Å, but more preferably about 1,500 Å.

Figure 3F:
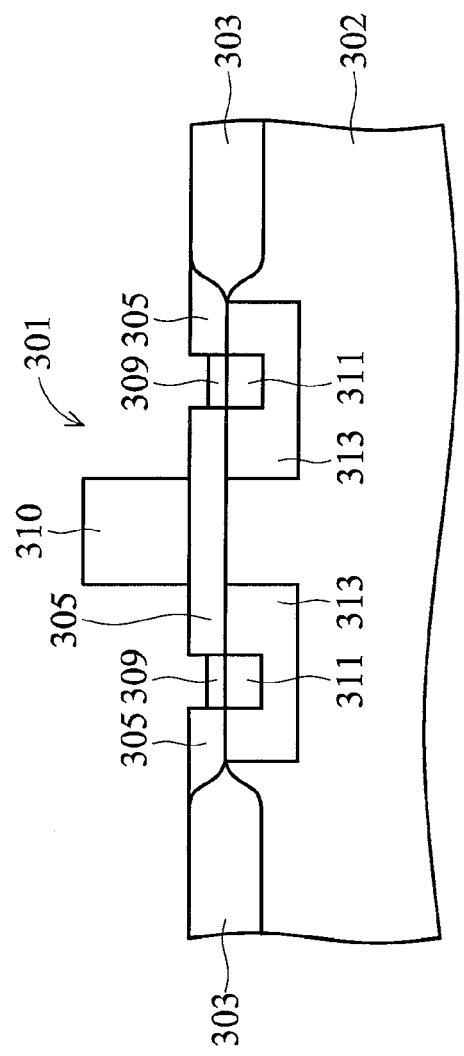

FIG. 3F illustrates the formation of the high-dose regions 311 and the low-dose regions 313 that comprise the DDDs. In an embodiment the first dielectric layer 305 and the second dielectric layer 309 are used to filter high- and low-energy implants, such that the high-dose region 311 and the low-dose region 313 are formed in the substrate 302 beneath the first dielectric layer 305 and the second dielectric layer 309. In an embodiment, an NMOSFET device can be created by first implanting a dopant such as phosphorous into the low-dose region 313 and the high-dose region 311. This can be performed using a high-energy implantation until the high-energy implant has a depth of between about 0.1 μm and about 0.3 μm, and a concentration between about $2\times10^{12}$ atoms/cm$^2$ and about $8\times10^{12}$ atoms/cm$^2$. A low-energy implantation of phosphorous is also performed, which will pass through the first dielectric layer 305 and the second dielectric layer 309 differently than the high-energy implant, and will form to a depth of between about 0.008 μm and about 0.04 μm, and a concentration between about $1\times10^{13}$ atoms/cm$^2$ and about $1\times10^{16}$ atoms/cm$^2$.

In another embodiment a PMOSFET can be formed by creating the low and high-dose regions with a dopant such as boron. Boron can be implanted using a high-energy implantation to form the low-dose region 313 with a depth of between about 0.1 μm and about 0.30 μm, and a concentration between about $2\times10^{12}$ atoms/cm$^2$ and about $8\times10^{12}$ atoms/cm$^2$, and then boron can be implanted through a low-energy implantation to form the high-dose region 311 which has a depth of between about 0.008 µm and about 0.04 µm, and a concentration between about $1\times10^{13}$ atoms/cm$^2$ and about $1\times10^{16}$ atoms/cm$^2$. The differences in the filtering between the first dielectric layer 305 and the second dielectric layer 309 create the separate regions of the DDDs.

Alternatively, the device as shown in FIG. 3F can be completed by implanting different species into the substrate 302 instead of using high- and low-energy implantation techniques. In the preferred embodiment an NMOSFET can be made by first implanting a light species (such as phosphorous) into the substrate 302 to a depth of between about 0.10 µm and about 0.30 µm and a concentration between about $2\times10^{12}$ atoms/cm$^2$ and $8\times10^{12}$ atoms/cm$^2$ in order to make the low-dose region 313. The high-dose region 311 can then be formed by implanting a heavier species (such as antimony or arsenic), to a depth of between about 0.008 µm and about 0.04 µm and a concentration of between about $1\times10^{13}$ atoms/cm$^2$ and about $1\times10^{16}$ atoms/cm$^2$.

In another embodiment a PMOSFET can be formed by implanting a light species (such as boron) into the substrate 302 to a depth of between about 0.10 µm and about 0.30 µm and a concentration between about $2\times10^{12}$ atoms/cm$^2$ and $8\times10^{12}$ atoms/cm$^2$ to make the low-dose region 313, and then forming the high-dose region 311 by implanting a heavier species (such as BF$_2$+) to a depth of between about 0.008 µm and about 0.04 µm and a concentration between about $1\times10^{13}$ atoms/cm$^2$ and $1\times10^{16}$ atoms/cm$^2$. Similar to the previous embodiment, the different filtering effects of the first dielectric layer 305 and the second dielectric layer 309 create a DDD as these light and heavy species are implanted through them.

It should be noted that, while the specific materials and processes described above may be used, other materials known in the art can be used for the heavy and light species and other ion implantation techniques such as plasma enhanced ion implantation can also be used.

As one of ordinary skill in the art will appreciate, one of the advantages of an embodiment of the present invention is the elimination of both the thermal anneal and the masking layer between the implantations as required by the prior art. Without the thermal anneal, there will be a reduced thermal budget required, and necessarily, the cost of manufacturing will be reduced. Without the extra masking layer required between implantations, the process is simplified.

Although the present invention and its advantages have been described in detail, it should be understood that various changes, substitutions and alterations can be made herein without departing from the spirit and scope of the invention as defined by the appended claims. For example, there are multiple methods for the implantation of ions. Any of these methods of implantation that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A method of forming a semiconductor device, the method comprising:
   providing a substrate having isolation regions formed thereon;
   forming a first dielectric layer with a first thickness on the substrate;
   patterning the first dielectric layer, thereby substantially exposing portions of the substrate;
   forming a second dielectric layer with a second thickness over the exposed portions of the substrate, the second thickness being different than the first thickness;
   forming a gate electrode on the first dielectric layer; and
   forming double diffused drain regions by implanting dopants through the first and second dielectric layers.

2. The method of claim 1, wherein the substrate comprises a high voltage region and a low voltage region separated by the isolation regions.

3. The method of claim 1, wherein the device is a P-type MOSFET.

4. The method of claim 1, wherein the device is an N-type MOSFET.

5. The method of claim 1, wherein forming double diffused drain regions is performed at least in part by a high-energy implant and a low-energy implant.

6. The method of claim 1, wherein forming double diffused drain regions is performed at least in part by implanting a heavy material and implanting a light material.

7. The method of claim 1, wherein the second dielectric layer has a thickness less than the first dielectric layer.

8. A method of forming a double diffused drain metal oxide semiconductor field effect transistor, the method comprising:
   providing a substrate having isolation regions formed thereon;
   forming a first dielectric layer with a first thickness on the substrate;
   patterning the first dielectric layer, thereby substantially exposing portions of the substrate;
   forming a second dielectric layer with a second thickness over the exposed portions of the substrate, the second thickness being different than the first thickness;
   forming a gate electrode on the first dielectric layer; and
   forming double diffused drain regions by implanting dopants through the first and second dielectric layers, wherein the forming double diffused drain regions comprises:
      performing a first implantation using a first energy level to form a first dose region; and
      performing a second implantation using a second energy level to form a second dose region, wherein the second energy level is different from the first energy level.

9. The method of claim 8, wherein the first dose region has a concentration between about $2\times10^{12}$ atoms/cm$^2$ and about $8\times10^{12}$ atoms/cm$^2$.

10. The method of claim 9, wherein the first energy implant has a depth of between about 0.1 µm and about 0.3 µm.

11. The method of claim 8, wherein the second dose region has a concentration between $1\times10^{13}$ atoms/cm$^2$ and about $1\times10^{16}$ atoms/cm$^2$.

12. The method of claim 11, wherein the second energy implant has a depth of between about 0.008 µm and about 0.04 µm.

13. The method of claim 8, wherein the second dielectric layer has a thickness less than the first dielectric layer.

14. A method of forming a semiconductor device, the method comprising:
   providing a substrate having isolation regions formed thereon;

forming a first dielectric layer with a first thickness on the substrate;

patterning the first dielectric layer, thereby substantially exposing portions of the substrate;

forming a second dielectric layer with a second thickness over the exposed portions of the substrate, the second thickness being different than the first thickness;

forming a gate electrode on the first dielectric layer; and forming double diffused drain regions by implanting dopants through the first and second dielectric layers, wherein the forming double diffused drain regions comprises:

performing a first implantation using a first material to form a first dose region; and performing a second implantation using a second material to form a second dose region, wherein the second material is different from the first material.

15. The method of claim 14, wherein the device is a P-type MOSFET.

16. The method of claim 14, wherein the device is an N-type MOSFET.

17. The method of claim 14, wherein the second thickness is less than the first thickness.

18. The method of claim 14, wherein the first material is a light species.

19. The method of claim 14, wherein the second material is a heavy species.

20. The method of claim 14, wherein the substrate comprises a high voltage region and a low voltage region separated by the isolation regions.

* * * * *